United States Patent
Sadowski et al.

(10) Patent No.: US 9,928,191 B2
(45) Date of Patent: Mar. 27, 2018

(54) COMMUNICATION DEVICE WITH SELECTIVE ENCODING

(71) Applicant: Advanced Micro Devices, Inc., Sunnyvale, CA (US)

(72) Inventors: Greg Sadowski, Boxborough, MA (US); John Kalamatianos, Boxborough, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 258 days.

(21) Appl. No.: 14/813,621

(22) Filed: Jul. 30, 2015

(65) Prior Publication Data
US 2017/0031853 A1  Feb. 2, 2017

(51) Int. Cl.
| G06F 13/00 | (2006.01) |
| G06F 13/36 | (2006.01) |
| G06F 13/362 | (2006.01) |
| G06F 13/42 | (2006.01) |
| H03M 13/43 | (2006.01) |
| H03M 13/00 | (2006.01) |

(52) U.S. Cl.
CPC .......... *G06F 13/362* (2013.01); *G06F 13/42* (2013.01); *H03M 13/43* (2013.01); *H03M 13/611* (2013.01); *Y02B 60/1228* (2013.01); *Y02B 60/1235* (2013.01)

(58) Field of Classification Search
None
See application file for complete search history.

(56) References Cited

U.S. PATENT DOCUMENTS

| 6,553,445 | B1 | 4/2003 | Drapkin et al. |
| 6,671,212 | B2 | 12/2003 | Macri et al. |
| 6,826,095 | B2 | 11/2004 | Macri et al. |
| 7,605,359 | B2 * | 10/2009 | Dai ...................... H04N 17/002 250/208.1 |
| 8,537,832 | B2 * | 9/2013 | Pirog .................... G06F 9/3851 370/395.4 |
| 2006/0034369 | A1 * | 2/2006 | Mohsenian .......... H04N 19/103 375/240.03 |

(Continued)

OTHER PUBLICATIONS

P. Sotiriadis, A. Chandrakasan, "Bus Energy Reduction by Transition Pattern Coding using a Detailed Deep Submicrometer Bus Model", IEEE Transactions on Circuits & Systems-I:FUndamental Theory and Applications, v50, n10, pp. 1280-1295, Oct. 2003.

(Continued)

*Primary Examiner* — Michael Sun
(74) *Attorney, Agent, or Firm* — Polansky & Associates, P.L.L.C.; Paul J. Polansky (57) ABSTRACT

A communication device includes a data source that generates data for transmission over a bus, and that further includes a data encoder coupled to receive and encode outgoing data. The encoder further includes a coupling toggle rate (CTR) calculator configured to calculate a CTR for the outgoing data, a threshold calculator configured to determine an expected value of the CTR as a threshold value, a comparator configured to compare the calculated CTR to the threshold value wherein the comparison is used to determine whether to perform an encoding step by an encoding block configured to selectively encode said data. A method according to one embodiment includes determining and comparing a CTR and an expected CTR to determine whether to encode the outgoing data. Any one of a plurality different coding techniques may be used including bus inversion.

20 Claims, 7 Drawing Sheets

(56) References Cited

U.S. PATENT DOCUMENTS

| | | | | |
|---|---|---|---|---|
| 2011/0084737 | A1* | 4/2011 | Oh | H04L 25/49 327/108 |
| 2013/0107948 | A1* | 5/2013 | DeForest | H04N 19/20 375/240.08 |
| 2013/0159761 | A1* | 6/2013 | Baumgartner | H04L 1/22 714/4.5 |
| 2013/0166580 | A1* | 6/2013 | Maharajh | H04L 65/605 707/758 |
| 2015/0081932 | A1* | 3/2015 | Ramani | G06F 5/00 710/54 |
| 2016/0226514 | A1* | 8/2016 | Liaghati | H03M 7/3055 |

OTHER PUBLICATIONS

Y.Zhang, J. Lach, K.Skadron, M.R. Stan, "Odd/Even Bus Invert with Two-Phase Transfer for Buses with Coupling", International Symposium on Low Power Electronics & Design, pp. 80-83, Aug. 2002.

M.R. Stan and W. Burleson, "Bus-Invert for Low Power I/O", IEEE Transactions on Very Large Scale Integration (VLSI) Systems, vol. 3, No. 1, pp. 49-58, Mar. 1995.

P. Sotiriadis, A. Chandrakasan, "Low Power Bus Coding Techniques Considering Inter-Wire Capacitances", Custom Integrated Circuits Conference, 4 pages, May 2000.

Tiehan Lv, J. Henkel, H. Lekatsas, W. Wolf, "A Dictionary-based En/Decoding Scheme for Low Power Data Buses", IEEE Transactions on VLSI, v11, n5, pp. 943-951, Oct. 2003.

G. Cormode, M. Hadjieleftheriou, "Finding the Frequent Items in Streams of Data", Communications of the ACM, v52, n10, 8 pages, Oct. 2009.

Meysam Taassori, Shaahin Hessabi, "Low Power Encoding in NoCs based on Coupling Transition Avoidance", IEEE 12th Euromicro Conference on Digital System Design, Architectures, Methods and Tools, pp. 247-254, Aug. 2009.

* cited by examiner

COMMUNICATION DEVICE WITH SELECTIVE ENCODING

FIELD OF THE DISCLOSURE

The present disclosure relates generally to integrated circuit and device communications, and more particularly to bus communication systems.

BACKGROUND

Data that represents command information, audio data, video data, and other types of information are often transmitted from one chip to another and even intra-chip. For example, a data transmitter may receive outgoing data that is to be transmitted on a bus that may have a large number of data lines for carrying the data. Many buses are configured to carry high data rate communications that exceed 1 Gb per second. Typically, the transmitter generates a plurality of ones and zeros on the bus representing the data that is then received and processed at a receiving end of the bus.

Because, especially at these frequencies, line capacitance requires energy to charge or discharge a logic state presented on the line, a notable cumulative amount of power is consumed from changing logic states of the data on the data lines.

Systems have been developed to reduce the number of transitions required to convey data over communication buses. One problem, however, is that such systems either are overly simplistic and not as effective as desired or, conversely, are complicated and consume large amounts of power as well as integrated circuit real estate. For example, if a number of bus toggles exceeds 50 percent of the data lines, then bus inversion coding may be used to reduce the number toggles and, therefore, to save energy. It should be understood, however, that if coding occurs, a receiver must receive a signal indicating that coding has been performed so that the received data may properly be interpreted or extrapolated.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Figure 1:
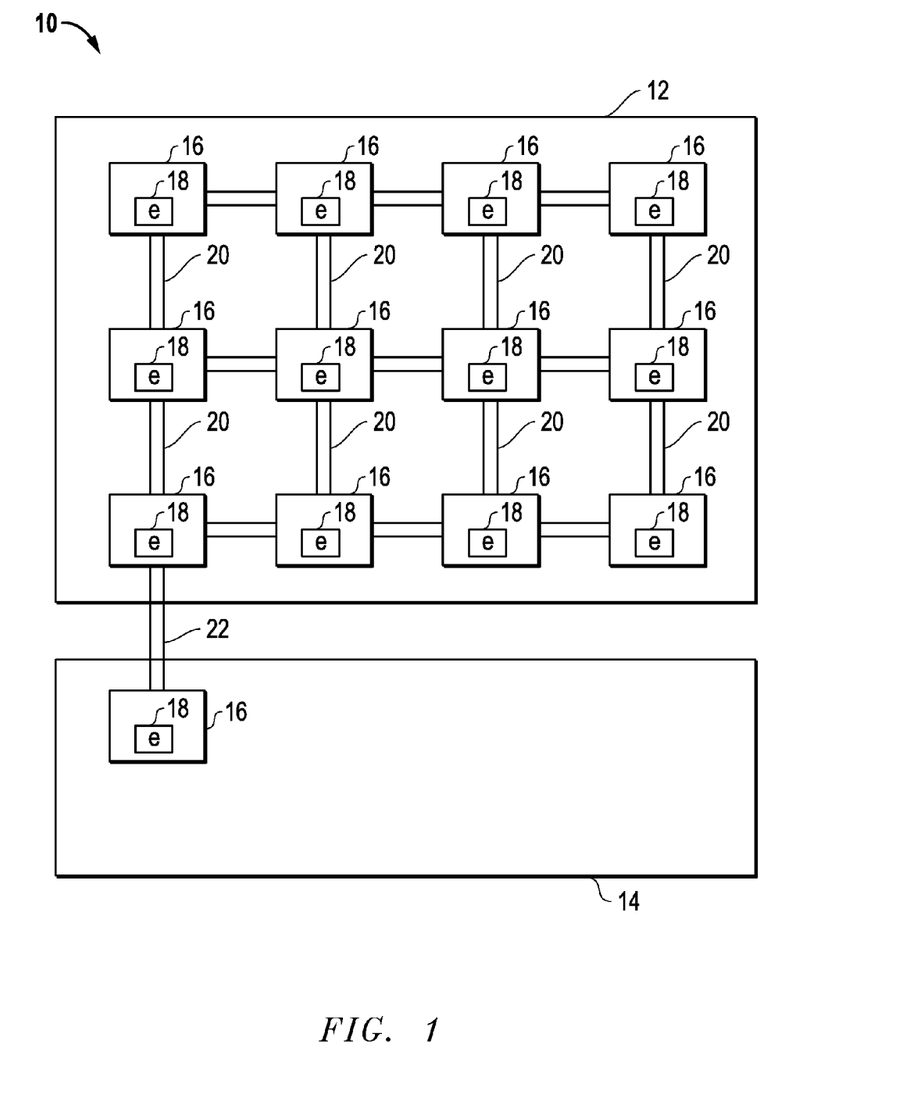
FIG. 1 illustrates, in block diagram form, a communication system including a network on a chip that includes a plurality of communication devices, each of which that includes an encoder that operates according to the embodiments described herein.

FIG. 1 illustrates, in block diagram form, a communication system including a network on a chip that includes a plurality of communication devices, each of which that includes an encoder that operates according to the embodiments described herein. Referring now to FIG. 1, a communication system 10 includes two integrated circuits 12 and 14 that each includes one or more communication devices or data sources. More specifically, each of the two integrated circuits 12 and 14 include at least one data source 16. Each data source 16 includes an encoder 18 for encoding data to reduce power consumption. As may be seen, integrated circuit 12 includes a plurality of data sources 16 and encoders 18. Each data source 16 communicates with other circuitry that includes data sources 16 via a communication bus 20. At least one data source 16 of integrated circuit 12 is coupled to communicate via a bus 22 with circuitry that includes a data source 16 of integrated circuit 14. It should be understood that each data source 16 includes circuitry for receiving communications from another data source 16 and includes a decoder to decode received data (not shown here).

The power that data movement draws on the bus transmissions is mainly due to signals changing their logic state or due to bus toggle rates. This is true for the data links of a network-on-chip and on any longer bus-interconnect inside silicon chips such as each bus 20 of FIG. 1 and for each bus 22 that carries inter-chip data communications. The energy needed to move a bit of data (single transition of the data signal either from low to high or high to low voltage level) over some standard unit length (usually 1 mm) at a given speed of operation, can be evaluated but it is generally know that toggling data has an energy cost that cumulates to reduce battery life. The data movement energy/bit/length consists of energy of active components of interconnect circuit like buffers and re-timing flops, and passive components like segments of wires in various metal levels, vias between metal layers and contacts to active logic.

The width of data buses are typically $2^n$ where n is natural number e.g. 32, 64, 128 . . . 512, etc. Depending on data-wire routing implementation of a silicon die, bus wires can be at a distance from each other, or they can be close (close is usually the case as the routing area is expensive). When wires are close to each other (the "minimum" distance defined in certain design-rule sets is called wire half-pitch), then there is significant coupling capacitance between any adjacent wires. When signals on adjacent wires switch their logical levels and therefore electrical potentials the coupling capacitance may be charged, discharged or re-charged, which cost energy. Therefore the energy of data movement on chip includes the between wires coupling switching energy in addition to energy of single interconnect circuit. Part of the energy consumed is to charge parasitic capacitances associated with the data wires of the buses 20 and 22. For example, wire-to-ground capacitances (Cs and Cf) and wire-to-wire or wire-to-shield capacitances (Cc) all absorb charge for a signal (especially for a signal transition) and thus consume power. Cf accounts for the part of electrical field that originates at the side of a wire but ends in the ground plane (substrate).

The energy consumption contributed by buses has been increasing (both in absolute numbers as well as a percentage over the entire system on a chip (SOC) energy consumption) because: (a) as more transistors are added in a SOC, longer buses are needed to enable connectivity between the ever increasing number of modules added to a SOC, (b) as the computational rate increases per SOC (higher number of central processing unit (CPU) and/or graphics processing unit (GPU) cores), the number of interconnects increases non-linearly and in some cases networks on a chip (NOC)s are proposed to enable scalable communication between the number of modules in the SOC in certain cases wider buses are added to allow fast data transfer to computational resources.

For example, NOCs or bus-based interconnects can be used to (a) allow multiple CPU cores to communicate with a shared, banked L2 cache, (b) allow the L2 cache banks to communicate with L3 cache banks if the L3 is physically partitioned, (c) allow the Compute Units (CUs) of a GPU to communicate with their L1/L2 cache banks, (d) enable the memory traffic generated by a GPU and a CPU core complex to communicate with the dynamic random access memory (DRAM) controller, (e) enable the memory traffic generated in a multi-level memory system (DRAM, non-volatile memory (NVM), etc.) to travel across the different levels. In addition, NOCs or bus-based interconnects are used to handle the demand, probe and victim command/data traffic that is observed between cache levels either in a CPU or a GPU core complex. As more CPU and/or GPU cores are added to a SOC, shared caches are partitioned every further and more interconnects (or NOC links) are needed to maintain connectivity. On the average these interconnects also get longer even if a NOC is used. Moreover, the width of interconnects, including NOC links, increases to provide higher bandwidth and lower latency (for a given packet size). In addition, as computational resources become wider (e.g., 128->256->512-bit Floating Point Unit (FPU) per CPU core or accelerator), their supporting buses used to transfer data also need to widen, in order to sustain peak computation rate. Finally, all of these interconnects need to operate in high voltage and frequency in order to provide maximum bandwidth and lowest latency.

As a result, the dynamic energy consumed by interconnects keeps increasing. There are two components to bus dynamic energy consumption: (1) per-wire, switching energy and (b) inter-wire, coupling energy. Switching energy is consumed when we draw current from the supply to charge per-wire's self-capacitance (e.g., the capacitance of a wire to ground or between adjacent wires). Inter-wire energy is consumed when we draw current from the voltage supply to charge coupling (or inter-wire) capacitance. Even though coupling is found between non-neighbor wires in a bus, in practice, only the coupling capacitance between neighboring wires is significant enough.

Generally, each data source 16 of integrated circuits 12 and 14 includes an encoder system that determines whether to encode data to reduce power consumption due to parasitic capacitance of the data lines of the associated communication bus. One common encoding technique is data or bus inversion coding. Bus inversion coding comprises inversion of binary values of all the bits on the bus for one (or more) particular data word to lower the dynamic transmission power. An extra signal is required to indicate the inversion is sent together with the data, and used by the receiver to undo the inversion. For this technique, data is inverted if inverting the individual bits of the data reduces a number of data toggles. Generally, one issue is determining whether such encoding should be performed.

While bus inversion is a common encoding technique, other types of encoding or techniques may be used also or in the alternative. Some of these other types include:

Out of order transmission encoding—the transmitter requires a data buffer in which it can hold a number of data words (or flits) and it transmit them in a different order than they have been written to transmitter buffer. The transmitter decides which word to send next based on the Bus Toggle Rate (BTR) calculations. The BTR is a sum of Signal Toggle Rate (STR) and Coupling Toggle Rate (CTR) The transmitter picks the word that causes the lowest BTR value. A number of extra signals are required to convey the "out of order" information to the receiver.

Temporal signal encoding—this is applicable to data transmission environments where STR is dominant compared to CTR. More frequent temporal signal patterns are replaced with low power patterns e.g. if a particular bit switches with high frequency, we can encode that signal in such a way that one voltage level (let's say LOW) means the signal is switching, thus lowering the STR and power.

Spatial signal encoding—this is applicable to data transmission environments where CTR (coupling toggle rate) is dominant compared to STR. More frequent spatial signal patterns are replaced with low power patterns e.g. if a particular 2-bits data bus signals switch with high frequency between 01⇔10 the signals are encoded so that instead of sending 10-01 pattern, a 10-11 pattern is sent instead basically replacing the 10-01 pattern with 10-11 pattern. The new pattern has a lower transition cost. More frequent temporal signal patterns are replaced with low power patterns e.g. if a particular bit switches with high frequency, we can encode that bit in such a way that one voltage level (e.g. LOW) means the signal is switching, thus lowering the CTR and power.

SSB-DDR-CG encoding—SSB=source synchronous bus; DDR=double data rate; CG=clock gating. That technique utilizes SSB, DDR, and CG technique to lower the power of data transmission. Effectively two signals are sent on one wire along with a data-timing signal (or clock) together with the data. The clock is gated so it never toggles when data is not transmitted.

Bus Barrel-Shift encoding—for every word to be sent over a bus a test is performed to determine whether shifting all the bits of the word to the left or to the right by some number of bits—lowers the BTR, and if it does then the shifted data together with extra signals that indicate how much it was shifted and which way is sent so the receiver can properly undo the shifting and recover the original data.

Pulse Position Modulation encoding—instead sending the data as binary numbers over a bus (the whole number in propagating at the same time over the bus), start and end signals and the time interval between them is equal to that number are sent. The receiver measures the time between start and end signals and that's the received number.

Data transmission array encoding—a transmission buffer is organized such that the number of data words that fits into a transmission buffer is equal to number of bits in the word e.g. 32 of 32-bit words. The data is read from the transmission buffer either the way they are written, or it is read with a bit by bit approach, i.e., the same bit of every data word is read at same time. The power for the normal and the alternative way of reading and transmitting the data is calculated and the lower power case is chosen. Extra information is sent to the receiver, so it can undo the mixed up data in its own receiving buffer.

Dictionary based encoding—frequently occurring patterns are replaced with other patterns (from dictionary) that require less energy to propagate. The transmitter and receiver have to maintain the same dictionaries, which may change over time. Frequently occurring patterns are captured in the dictionaries of the transmitter and the receiver with no explicit synchronization sync. If such patterns repeat then the transmitter sends the index into the dictionary (instead of the pattern) over the link. The receiver knows that the new message is index or data via a separate wire and if it's an index it accesses its own dictionary to retrieve the data.

It should be understood that any type of coding could be utilized to reduce power consumption associated with toggling data lines. Generally, however, one problem with many of the techniques including bus inversion is that coupling between adjacent signals is not taken into account. A bus toggle count, i.e., the sum of signal toggles, simply comprises a count of all bus lines that are toggled to make the determination whether to invert the bus. In deep submicron silicon technologies, however, the capacitance between adjacent wires dominates over capacitance of wire to ground, so the bus inversion technique (or other coding technique) is modified in the described embodiments to include the effects of switching coupling capacitance between data lines. The decision whether or not to apply inversion may be based on calculation of bus toggle count for the inverted and non-inverted bus. The bus toggle rate (BTR) is composed of two components as shown by the following formula:

$$BTR=STR+CTR*\lambda,$$

where $\lambda=C_{couple}/C_{self}$

For this determination, STR (signal toggle rate) and CTR (coupling toggle rate) are calculated by comparing "bit by bit" for the last data word to the subsequent one. Either a consumption or dissipation model can be used in hardware implementation for calculating the bus toggle rates. Thus, one possible approach for making a determination to code or not code the data includes calculating a BTR that includes calculating a sum of STR as well as a CTR values for each of the bits of the data word.

In an alternative approach, employed by the encoder systems reflected in FIG. 1, three techniques are employed to lower area and power consumption: First, STR is not calculated because CTR is generally dominant in relation to STR as λ grows with technology nodes. Second, the encoder uses a constant value instead of a programmable value for the Lambda parameter. A variety of values may be used (e.g., 1, 2, 3 or 4) according to what yields the best results. This can be determined on a case by case basis without undue experimentation. Third, a CTR value per data transferred is calculated and compared to a threshold value (a statistically based expected value) to make the determination whether to encode (e.g., invert) the data. Some power savings are realized by using an expected value of CTR that is periodically calculated instead of comparing a CTR for outgoing data to a CTR for encoded outgoing data. By employing all three techniques, the encoder logic is simplified thus lowering power, area and processing time. This is done at the expense of occasionally making wrong encoding decisions (error) that can lead to higher dynamic power consumption on the bus. By tuning the method for approximating an optimal threshold CTR value, however, the error rate can be minimized leading to overall lower power consumption and less integrated circuit real estate. Yet another benefit of this alternative approach is that the reduced circuit size makes it possible to employ such techniques for lower capacity or distance buses for which the prior approach would not be justified. Thus, for example, a network on a chip as shown in FIG. 1 may employ encoders for each data source as shown in FIG. 1 and certainly more encoders than would be feasible with the more comprehensive approach.

Figure 2:
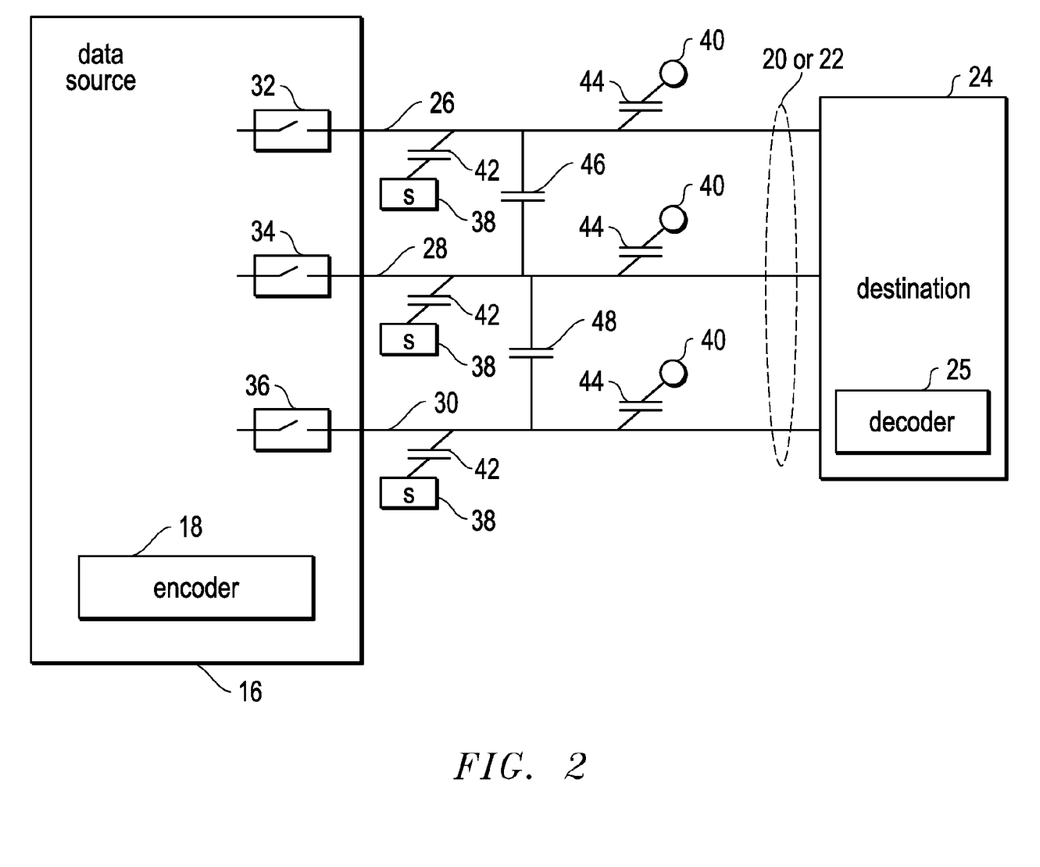
FIG. 2 illustrates partially in block form and partially in schematic form a communication system that includes a data source, a bus and a destination that communicate according to at least one embodiment.

FIG. 2 illustrates partially in block form and partially in schematic form a communication system that includes a data source, a bus and a destination that communicate according to at least one embodiment. Referring now to FIG. 2, a data source 16 includes an encoder for selectively encoding communications over a bus 20 or 22 intended for a destination 24. As may be seen, destination 24 includes a decoder 25 that is configured to decode received data according to an indicated type of encoding received that corresponds to the received data. While decoder 25 is not shown in all the figures, it should be understood that each transceiver includes an encoder and a decoder to support communications in both directions. For the purposes of this figure, the figure will be described in relation to a bus 20 which is for intra-chip communications though it well could be in reference to a bus 22 which is for inter-device or circuit board communications. Bus 20 includes a plurality of data lines though only three adjacent data lines, namely data lines 26, 28 and 30, are shown here in FIG. 2.

Within data source 16, three switches are shown, namely switches 32, 34 and 36 that are each connected to one of three data lines of bus 20. The switches represent the coupling and decoupling of a signal to a data line for data communications. As may be seen, each of the data lines 26, 28 and 30 includes a capacitance 42 coupled between the data line and a substrate 38 of the device. Additionally, each data line 26-30 includes a capacitance 44 between the data line and ground 40. Finally, a capacitance exists between the data lines as well. More specifically, a capacitance 46 is shown across data lines 26 and 28 and a capacitance 48 is shown between data lines 28 and 30. There may also be a capacitance between lines 26 and 30 both that is not shown in this figure for simplicity.

One aspect of the described embodiment is that the encoder 18 of data source 16 accounts for the energy required to toggle each of the data lines 26-30 based on current signal states as well as each of the aforementioned types of capacitance described here in FIG. 2. More specifically, in at least one embodiment, a part of calculating a threshold value that is to be compared to a CTR for an outgoing data includes an evaluation of changing or toggling a data line in view of one or more of all of the capacitive effects.

Figure 3:
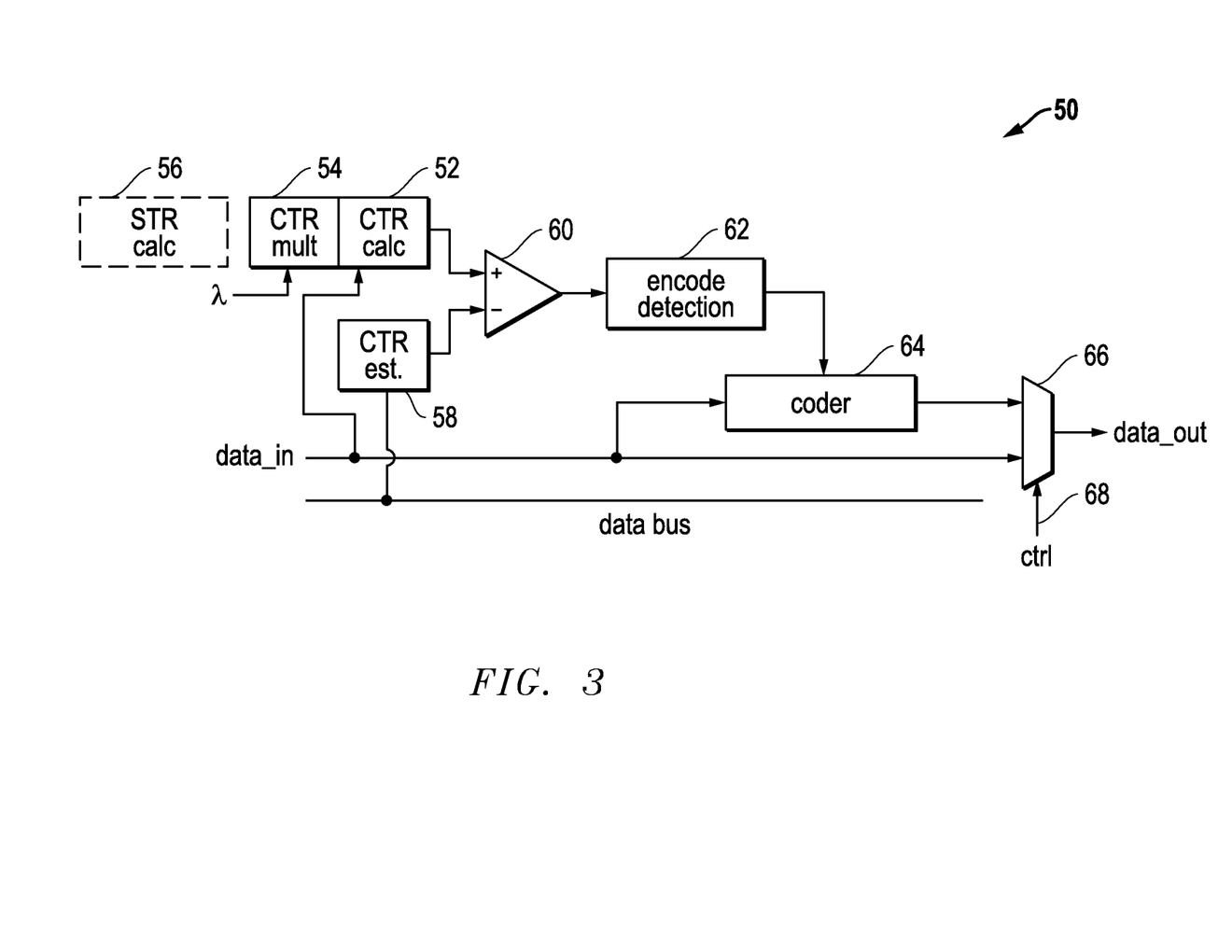
FIG. 3 illustrates in block form an encoder that operates according to at least one embodiment.

FIG. 3 illustrates in block form an encoder that operates according to at least one embodiment. Referring now to FIG. 3, a data coding system 50 is shown that includes logic for determining whether to encode outgoing data according to one embodiment. One aspect that may be noted in the embodiment of FIG. 3 is that circuitry may be substantially simplified by eliminating STR calculation logic and CTR multiplication logic. The power savings from eliminating this circuitry extends battery life in portable devices. The simplification of the circuitry allows such logic to be used to achieve additional savings for smaller buses (in terms of bus length and/or width) that would not be feasible with the larger circuits.

More specifically, a CTR calculator 52 is shown that generates a CTR value for outgoing data. CTR calculator 52 is coupled to receive outgoing data, shown as data_in. While data_in is outgoing data, the name reflects the outgoing data that is being input to the encoding systems of the described embodiments. CTR calculator 52 includes a CTR multiplier that multiplies a calculated CTR value against fixed value of Lambda as a part of calculating CTR for the outgoing data. CTR calculator 52 is coupled to produce an output to one input of comparator 60. CTR estimator 58 is coupled to receive data samples taken from the data bus and is further coupled to produce an output to the other input of comparator 60. The output of comparator 60 is coupled to encode determination 62. An output of encode determination 62 is produced to coder 64. Coder 64 is further coupled to receive the outgoing data shown as data_in. Coder 64 produces a coded output to data selector 66. The outgoing data data_in is also produced to an input of data selector 66. The output of data selector 66 is the outgoing data shown as data_out. Data selector 66 is further coupled to receive a control signal 68 to select between the coded data and the outgoing data and produces the selected data as data_out.

In operation, CTR calculator 52 produces CTR values to comparator 60. CTR estimator 58, in this embodiment, produces a threshold value that comprises an expected CTR value that based on prior data for comparison within comparator 60. The expected CTR value, or threshold value, and represents an expected value for the CTR value based on a sample of prior data and is produced to comparator 60 for comparison with the CTR. The two numbers are compared and the outcome generated by comparator 60 is produced to encode determination 62. Encode determination 62 generates an indication to coder 64 as to whether the outgoing data (shown as "data_in") should be encoded. A control signal 68 is generated and produced to data selector 66 to select between the outgoing data, which is un-coded, and the encoded data. In the described embodiment, control signal 68 may be produced by encode determination 62 or coder 64. FIG. 3 also shows the data bus that carries data_out.

An STR calculator 56 is shown in dashed lines to represent circuitry that is not necessary in the described embodiment and more specifically to illustrate savings in IC real estate and power consumption. Generally, by calculating and using a threshold value (a CTR expected value) for comparison against a calculated CTR value for the outgoing data in a comparator saves notable amounts of power and integrated circuit real estate for a small loss in performance. Further, by using a fixed value of lambda to multiply against the CTR rather than a calculated value of lambda, IC real estate and power consumption are reduced.

Figure 4:
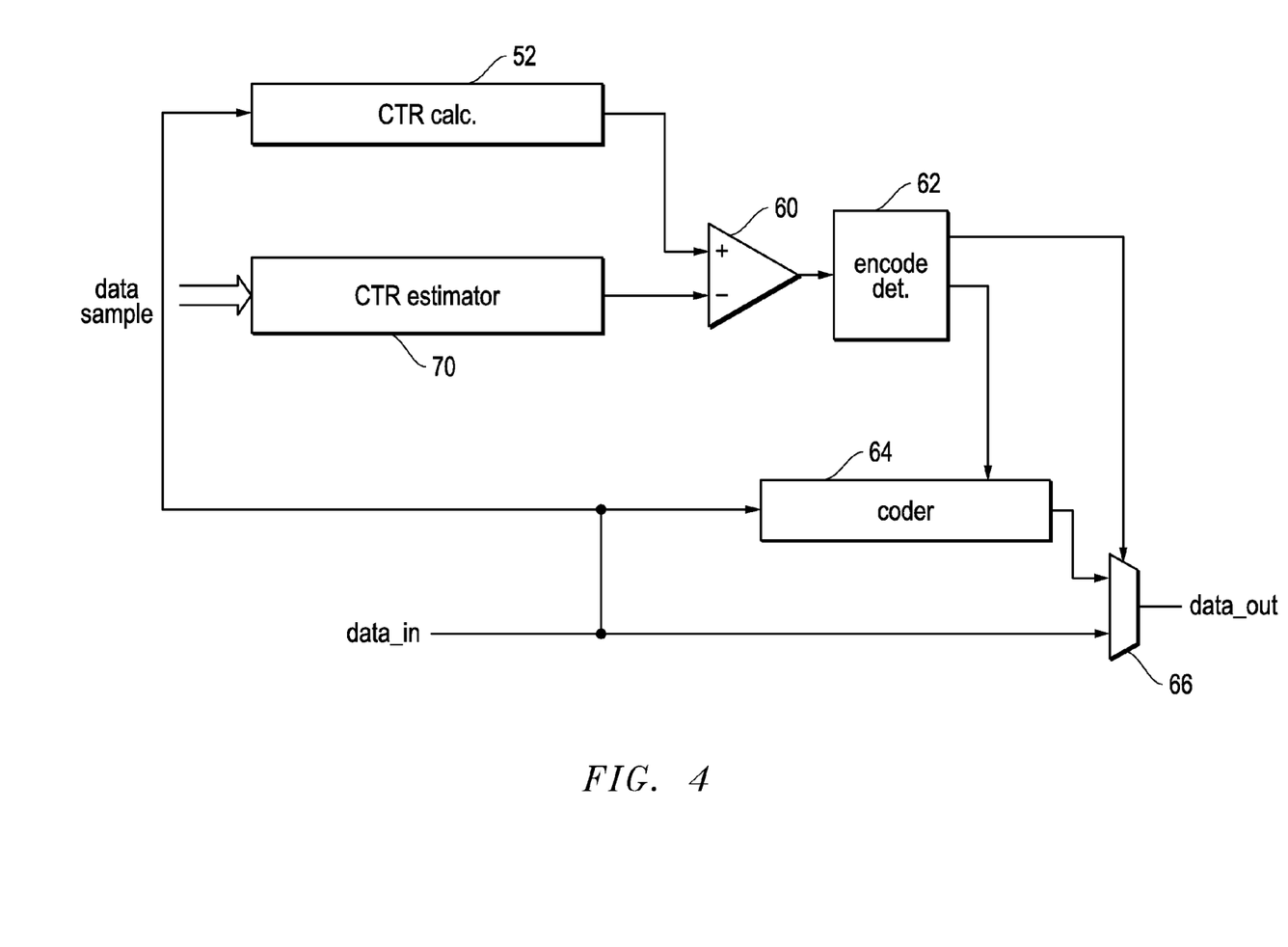
FIG. 4 illustrates in block form an encoder system according to one embodiment.

FIG. 4 illustrates in block form an encoder system according to one embodiment. Referring now to FIG. 4, a CTR calculator 52 is shown that generates a CTR value for outgoing data. CTR calculator 52 is coupled to receive outgoing data ("data_in") while CTR estimator 70 is coupled to receive data samples (for example, from the input communication bus. CTR estimator 70 is configured to periodically examine a plurality of outgoing data signals for generating CTR estimates (expected values) to be used as a threshold for comparison against current CTR values for outgoing data. CTR calculator 52 and CTR estimator 70 produce outputs that are compared one in comparator 60. The output of comparator 60 is coupled to encode determination 62. An output of encode determination 62 is produced to coder 64. Encode determination 62 also generates a control signal to data selector 66. Coder 64 is further coupled to receive the outgoing data shown as data_in. Coder 64 produces a coded output to data selector 66. The outgoing data, namely data_in, is also produced to an input of data selector 66. The output of data selector 66 is the outgoing data shown as data_out. Data selector 66 is coupled to receive the control signal generated by encode determination 62 to select between the coded data and the outgoing data and produces the selected data as data_out.

In operation, CTR calculator 52 produces a CTR value to one input of comparator 60. CTR estimator 70, in this embodiment, produces an estimated CTR threshold value comprising an expected CTR value based on periodic data samples for comparison within comparator 60. The expected CTR value, or threshold value, is produced to the other input of comparator 60 for comparison to the current CTR value. If the current CTR value 52 is greater than the estimated CTR value from estimator 70, comparator 60 generates an indication of the positive comparison to encoder determination 62. Encoder determination 62 generates an indication to coder 64 as to whether the outgoing data "data_in" should be coded. A control signal is generated and produced to data selector 66 by encode determination 62 to select between the outgoing data, which is un-coded, and the coded data. In an alternative embodiment, coder 64 may produce the control signal. Power savings are realized by calculating an expected value of the CTR on a periodic basis that is less frequent that the calculations for CTR that occur for every outgoing set of data shown as data_in.

In the described embodiment, the following formula represents the circuit operation for calculating the expected value of the CTR:

$$\text{expected CTR value} = (N)^*(0^*P(0) + 1^*P(1) + 2^*P(2) + M^*P(M))$$

where N=bus width, M=total number of different, possible CTR values and P(x)=probability of x, x=CTR value For example: if the bus with N=128, and the sum of the expected values (bit value times probability P(x)) for the bit values are equal to 0.75, then the expected value is 96 since 0.75*128=96.

Figure 6:
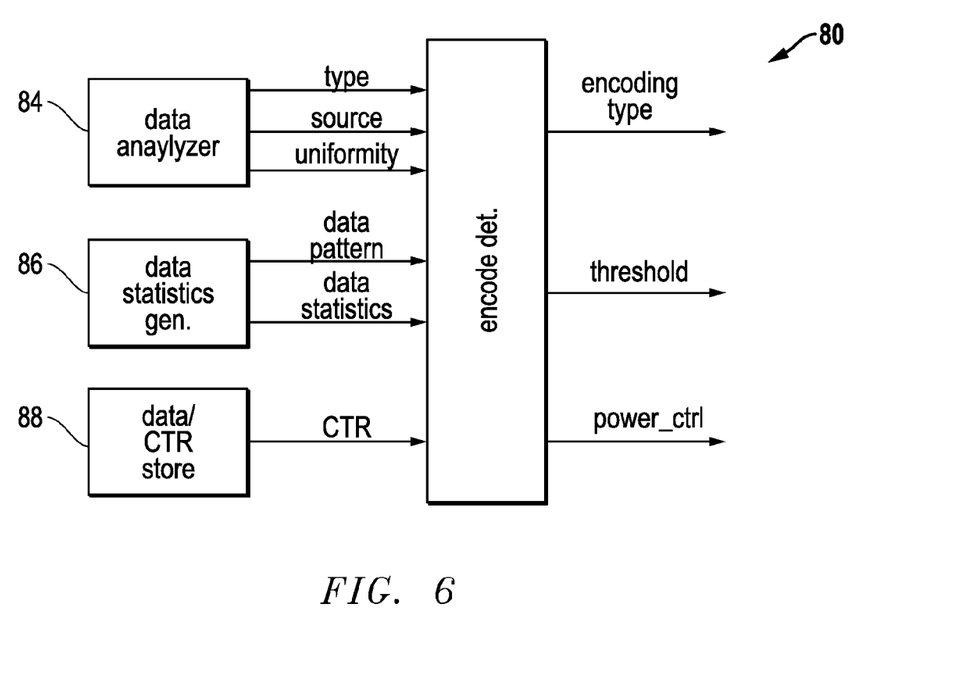
FIG. 6 illustrates in block form a system for determining a threshold value that is used to determine coding according to one embodiment.

More generally, to calculate the expected value in the described embodiment, the CTR estimator 70 evaluates a sum of a probability of a particular CTR value times that CTR value for all possible values of the CTR wherein the probability is based upon observed bits on a bus as a part of determining the threshold. Accordingly, the threshold is the expected value of the CTR value. The threshold can be also programmable by system based on learning algorithms or by application, etc. For example, the expected value of the CTR value may be based on data analysis of a periodic collection of bus statistics or outgoing data to calculate the expected value. The types of data analysis can include the type of data, the source of data, the uniformity of data, a data pattern, or even a statistical analysis of prior CTR values (e.g., a moving average, a mean value, etc.). FIG. 6 below illustrates one embodiment for such an approach.

Figure 5:
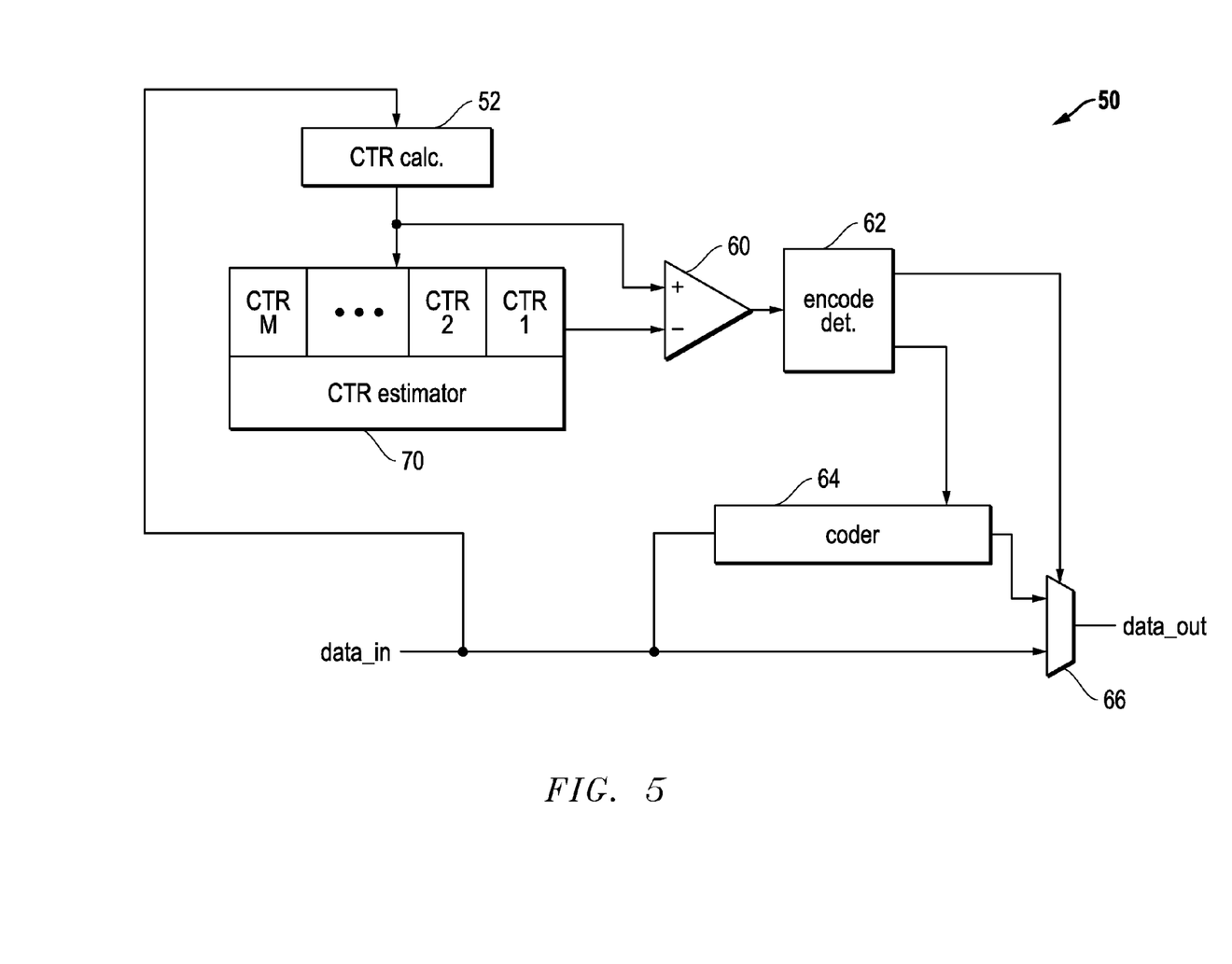
FIG. 5 illustrates in block form an encoder system according to an alternative embodiment.

FIG. 5 illustrates in block form an encoder system according to one embodiment. Referring now to FIG. 5, it may be seen that FIG. 5 is similar to FIGS. 3 and 4 but illustrates additional details for an alternative embodiment. More specifically, a CTR calculator 52 is shown that generates a CTR value for outgoing data. CTR calculator 52 is coupled to receive outgoing data, shown as data_in. CTR calculator 52 is coupled to produce an output to CTR estimator 70 as well as to one input of comparator 60. CTR estimator 70 is coupled to produce an output to the other input of comparator 60. The output of comparator 60 is coupled to encode determination 62. An output of encode determination 62 is produced to coder 64. Encode determination 62 also generates a control signal to data selector 66. Coder 64 is further coupled to receive the outgoing data shown as data_in. Coder 64 produces a coded output to data selector 66. The outgoing data data_in is also produced to an input of data selector 66. The output of data selector 66 is the outgoing data shown as data_out. Data selector 66 is coupled to receive control signal generated by encode determination 62 to select between the coded data and the outgoing data and produces the selected data as data_out.

In operation, CTR calculator 52 produces CTR values to CTR estimator 70 as well as to comparator 60. CTR estimator 70, in this embodiment, produces an estimated CTR threshold value based on prior data CTR values for comparison within comparator 60. As may be seen, CTR estimator 70 stores up to "M" previous CTR values to calculated an expected value for the CTR. In this alternative embodiment, the expected value may be, for example, an expected value based upon a moving average of CTR values that reflect a data trend. The expected CTR value, or threshold value, is produced to comparator 60 and for comparison to the CTR value for each instance of data_in. Thus, the expected CTR value here may comprise a statistical analysis based on prior CTR values to account for trends in CTR values. Other statistical calculations may be used. This embodiment is intended to illustrate variations in the methods for calculating an expected CTR for comparison. For example, if the current CTR value from calculator 52 is greater than the estimated CTR value from estimator 70 a decision is made to encode the data in this and other embodiments. Thus comparator 60 passes that indication of the comparison to encoder determination 62. Encoder determination 62 generates an indication to coder 64 as to whether the outgoing data "data_in" should be coded. A control signal is generated and produced to data selector 66 by encode determination 62 to select between the outgoing data, which is un-coded, and the coded data. In an alternative embodiment, coder 64 may produce the control signal. FIG. 5 also shows the data bus that carries data_out.

FIG. 6 illustrates in block form a system for determining a threshold value that is used to determine coding according to one embodiment. Referring now to FIG. 6, an encoding system 80 includes an encoded determination block 82 that is coupled to receive data from a data analyzer 84, from a data statistics generator 86, and from a data/CTR store 88. Encode termination 82 produces an indication of an encoding type, a threshold, and a power_ctrl signal for powering all or portions of included encoding block logic.

More specifically, data analyzer 84 produces an indication of a data type, a data source, and data uniformity to encode determination 82. Data statistics generator 86 produces a data pattern indication to encode determination 82 as well as other data statistics. Finally, data/CTR store 88 produces at least one of a CTR value for stored data or, alternatively, data from prior outgoing data to encode determination 82. Based on the received data from data analyzer 84, data statistics generator 86, and data/CTR score 88, encode determination 82 produces at least one of an encoding type indication, a threshold or expected CTR value, and a power_ctrl signal to power off or power on at least a portion of all encoding logic.

Generally, FIG. 6 illustrates that other parameters may be utilized to determine a threshold value or expected CTR value that is utilized as a part of determining whether to encode or transmit un-encoded data. For example, a CTR expected value may vary not only due to recent data patterns, but also due to a source or type of data or identified uniformity of data. Similarly, received data statistics may also alter an expected CTR value that is to be used as a threshold value when determining whether to encode and/or a type of encoding that is to be performed. Moreover, for certain types of data or data sources, encode determination 82 may determine that encoding logic may be disabled to save power so long as the type of data or data source does not change.

Figure 7:
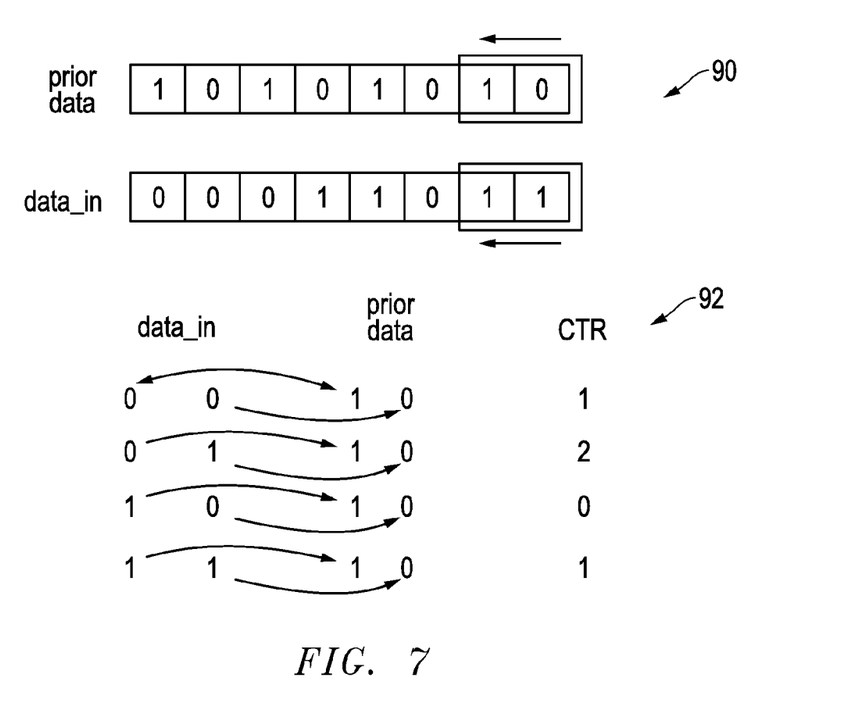
FIG. 7 is a diagram that illustrates a CTR calculation process according to one embodiment.

FIG. 7 is a diagram that illustrates a CTR calculation process according to one embodiment. This process may be similar to the embodiments of other figures that include a CTR calculator. Referring to FIG. 7, two data words are shown in a conceptual shift register at 90. The top "shift register" holds a prior data word while the bottom shift register holds a current data word from "data_in" that is to be output on a bus. Below the shift registers is a table that illustrates one way a CTR may be determined according to one embodiment for the data in the shift registers. The arrows reflect the bits that are compared for a change in logic state. Essentially, the same relative bits of the two data words are compared. The comparison can be done in parallel for all bit pairs to minimize the latency of CTR calculation. The right most column reflects the CTR value for the two comparisons. Essentially, the CTR reflects a change of state from either comparison. As may be seen, the four CTR sums are 1, 2, 0 and 1. The total sum, which is the CTR value for the outgoing word from data_in is "4". This CTR value of "4" would then be compared to an expected value for the CTR as described previously.

To further illustrate how a CTR value for an outgoing data is determined, consider the following table for the bit stream of "0 0 0 11 0 11" as outgoing data and "1 0 1 0 1 0 1 0" as the prior outgoing data as shown in FIG. 7. In operation, a plurality of CTR sums are calculated and summed to derive the CTR value that is compared to the expected value. The CTR values are calculated in a sliding two-bit window. The comparison, therefore, are as follows:

"0 0" is compared with "1 0" to yield a CTR value of "1" because one bit toggled from 0 to 1.

"0 1" is compared with "1 0" to yield a CTR value of "2" because two bits toggled, one from 0 to 1 and another from 1 to 0.

"1 0" is compared with "1 0" to yield a CTR value of "0" because no bits are toggled.

"1 1" is compared with "1 0" to yield a CTR value of "1" because one bit toggled from 1 to 0.

Because capacitance exists between adjacent lines, a CTR value of "1" is determined even when a data line transitions from 1 to 0 (as in the last comparison above) because energy from the supply is required to drain the capacitor as the data line changes state. Each of the CTR value is then summed for the data stream. For the example data streams, the calculated CTR value is equal to 1+2+0+1=4 This sum of CTR values is then compared to an expected CTR value to determine whether to code the data.

Figure 8:
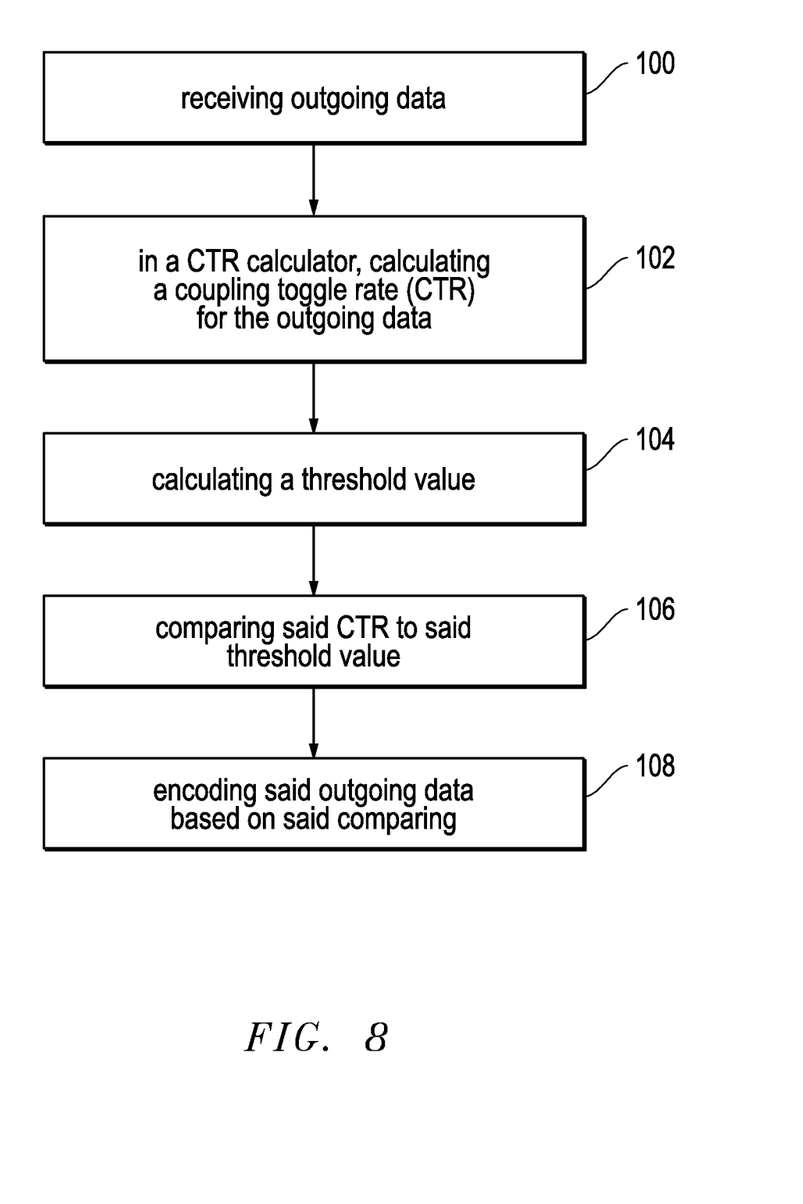
FIG. 8 is a flowchart that illustrates a method according to one embodiment.

FIG. 8 is a flowchart that illustrates a method according to one embodiment. Referring now to FIG. 8, the method includes an encoding system receiving outgoing data (100). Thereafter, the method includes, in a coupling toggle rate (CTR) calculator, calculating a coupling toggle rate for the outgoing data (102). The method further includes calculating a threshold or expected CTR value (104). This threshold or expected CTR value, in one embodiment, is an expected value is based on a sum of a probability of a particular CTR value times that CTR value for all possible values of the CTR wherein the probability is based upon observed bits on a bus as a part of determining the threshold. The threshold value may also be programmable based on a system of learning algorithms. The types of factors that may be considered include but are not limited to a data type, a data source, data uniformity, data statistics, a data pattern, etc.

After calculating a threshold or estimated value, the method includes comparing the calculated CTR for the outgoing data to the threshold or estimated value (106). Finally, the method includes encoding the outgoing data based, at least in part, on the comparing step (108).

Thus a transmitter has been described that operates to reduce power by determining whether and how to encode outgoing data based, at least in part, upon a difference between a calculated CTR and an expected CTR. While this process does have an error rate, the reductions in logic for a circuit that yields more precise results saves sufficient power to justify inefficiency due to the realized error rate.

All components can be implemented cheaply on a single integrated circuit using available low voltage CMOS manufacturing processes and various types of integrated circuit technology. For example, a data source or other device having active circuit components can be made using different transistor types, such as N-channel MOS transistors, P-channel MOS transistors, or various combinations of the two.

Because the savings in terms of integrated circuit real estate can be substantial when the described embodiments are employed in whole or in part, there will be many applications where a system as described herein may be utilized where the power or integrated circuit real estate costs for a more precise system would be prohibitive. Stated differently, the system and approach described herein will allow such coding logic systems to be employed for smaller length and smaller with buses than the more precise and larger systems.

The above-disclosed subject matter is to be considered illustrative, and not restrictive, and the appended claims are intended to cover all such modifications, enhancements, and other embodiments that fall within the true scope of the claims Additionally, the blocks and circuit elements may be implemented with various combinations of hardware and software, and the software component may be stored in a computer readable storage medium for execution by at least one processor. Moreover the method illustrated in FIG. 8 may also be governed by instructions that are stored in a computer readable storage medium and that are executed by at least one processor. Each of the operations shown in FIG. 8 may correspond to instructions stored in a non-transitory computer memory or computer readable storage medium. In various embodiments, the non-transitory computer readable storage medium includes a magnetic or optical disk storage device, solid state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

Moreover, integrated circuits 12 or 14 may be described or represented at least in part by a computer accessible data structure in the form of a database or other data structure which can be read by a program and used, directly or indirectly, to fabricate integrated circuit 12 or 14. For example, this data structure may be a behavioral-level description or register-transfer level (RTL) description of the hardware functionality in a high level design language (HDL) such as Verilog or VHDL. The description may be read by a synthesis tool that may synthesize the description to produce a netlist comprising a list of gates from a synthesis library. The netlist comprises a set of gates that also represent the functionality of the hardware comprising integrated circuit 300. The netlist may then be placed and routed to produce a data set describing geometric shapes to be applied to masks. The masks may then be used in various semiconductor fabrication steps to produce integrated circuit 300. Alternatively, the database on the computer accessible storage medium may be the netlist (with or without the synthesis library) or the data set, as desired, or Graphic Data System (GDS) II data.

Thus, to the maximum extent allowed by law, the scope of the present invention is to be determined by the broadest permissible interpretation of the following claims and their equivalents, and shall not be restricted or limited by the foregoing detailed description.

What is claimed is:

1. A communication device, comprising:
 a data source that generates data for transmission over a bus; and
 a data encoder coupled to receive and encode said data that further includes:
  a coupling toggle rate (CTR) calculator configured to calculate a CTR for said data, wherein said CTR calculator calculates said CTR by taking into account switching caused by inter-wire coupling on said bus;
  a threshold calculator configured to determine an expected value of said CTR as a threshold value;
  a comparator configured to perform a comparison of said CTR to said threshold value to determine whether to perform an encoding step; and
  an encoding block configured to selectively encode said data based on said comparison.

2. The communication device of claim 1 wherein said encoding block is configured to perform one or more types of encoding including:
 bus inversion encoding;
 out of order transmission encoding;
 temporal signal encoding;
 spatial signal encoding;
 SSB-DDR-CG encoding;
 bus barrel-shift encoding;
 pulse position modulation encoding;
 data transmission array encoding; and
 dictionary based encoding.

3. The communication device of claim 1 wherein said threshold calculator evaluates charging energy that includes switching energy per wire as well as said inter-wire coupling to calculate said threshold value.

4. The communication device of claim 3 wherein said charging energy comprises charging due to at least one of: line-to-ground capacitance, substrate capacitance ($C_s$ and $C_j$), or line-to-line capacitance ($C_l$).

5. The communication device of claim 4 wherein said data encoder includes an encode determination block that determines whether to encode based upon said comparison.

6. The communication device of claim 4 wherein said threshold calculator periodically samples data as a part of calculating said expected value.

7. The communication device of claim 1 wherein said expected value of said CTR is based upon a sum of CTR values times a probability of said CTR values for periodically sampled data.

8. The communication device of claim 1 wherein said threshold calculator evaluates as a part of determining said threshold value at least one of:
- uniformity of data patterns;
- a data class;
- a data source;
- a data type; and
- a detected data pattern.

9. The communication device of claim 1 wherein said threshold calculator periodically evaluates a sum of a probability of a particular CTR value times that CTR value for all possible values of said CTR wherein said probability is based upon observed bits on a bus as a part of determining said expected value.

10. A data coding system, comprising:
- a coupling toggle rate (CTR) calculator coupled to receive outgoing data to produce a CTR for said outgoing data, wherein said CTR calculator calculates said CTR by taking into account switching caused by inter-wire coupling;
- a threshold calculator configured to calculate a threshold value based on an expected value of said CTR;
- a comparator coupled to receive said threshold value and said CTR, wherein said comparator performs a comparison by determining if said CTR is greater than said threshold value;
- a coder that encodes said outgoing data based upon said CTR based upon said comparison; and
- a data selector that selects between said encoded outgoing data and said outgoing data based on said comparison.

11. The data coding system of claim 10 wherein said threshold calculator is configured to calculate a threshold value and is coupled to receive at least one of:
- said CTR;
- said outgoing data;
- a data characteristic;
- a data pattern;
- a data type;
- a data source;
- a data pattern; and
- a data class.

12. The data coding system of claim 10 wherein said outgoing data is coded when said CTR is greater than said threshold value.

13. The data coding system of claim 10 wherein said threshold calculator stores prior outgoing data and calculates an expected CTR value when determining said threshold value.

14. The data coding system of claim 10 further comprising a communication bus connected to a memory and to conduct said encoded outgoing data.

15. A method for selectively encoding outgoing data on a bus in an encoder, comprising:
- receiving outgoing data;
- in a coupling toggle rate (CTR) calculator, calculating a CTR for said outgoing data, wherein said CTR calculator calculates said CTR by taking into account switching caused by inter-wire coupling on the bus;
- calculating an expected CTR value based upon one of prior data or sampled data to determine a threshold value;
- comparing said CTR to said threshold value; and
- encoding said outgoing data based on said comparing of said CTR to said threshold value.

16. The method for selectively encoding outgoing data of claim 15 wherein said encoding comprises at least one type of encoding including:
- bus inversion encoding;
- out of order transmission encoding;
- temporal signal encoding;
- spatial signal encoding;
- SSB-DDR-CG encoding;
- bus barrel-shift encoding;
- pulse position modulation encoding;
- data transmission array encoding; and
- dictionary based encoding.

17. The method for selectively encoding outgoing data of claim 15 wherein said encoding includes evaluating at least one of:
- said CTR for prior outgoing data;
- a data characteristic for said outgoing data;
- a data pattern said outgoing data;
- a data type said outgoing data;
- a data source said outgoing data;
- a data pattern said outgoing data; and
- a data class said outgoing data.

18. The method of claim 15 wherein said encoding occurs only if said CTR is greater than said threshold value.

19. The method of claim 15 wherein said encoding includes inverting said outgoing data.

20. The method of claim 15 wherein an encode determination block determines whether to encode based upon said comparing.

* * * * *